US007511590B1

(12) United States Patent  (10) Patent No.: US 7,511,590 B1
Gehring  (45) Date of Patent: Mar. 31, 2009

(54) DIFFERENTIAL CRYSTAL OSCILLATOR

(75) Inventor: Mark Richard Gehring, Portland, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 1100 days.

(21) Appl. No.: 10/225,658

(22) Filed: Aug. 21, 2002

(51) Int. Cl.
H03B 5/32 (2006.01)
(52) U.S. Cl. .................. 331/158; 331/116 R; 331/46
(58) Field of Classification Search ............. 331/117 R, 331/46, 159, 158, 116 R
See application file for complete search history.

(56) References Cited

U.S. PATENT DOCUMENTS

| | | | | |
|---|---|---|---|---|
| 3,592,960 | A * | 7/1971 | Cushing et al. ............. 348/507 |
| 3,806,831 | A * | 4/1974 | Kleinberg ................... 331/159 |
| 5,113,156 | A * | 5/1992 | Mahabadi et al. .......... 331/109 |
| 5,166,645 | A * | 11/1992 | Watts ......................... 331/37 |
| 5,486,796 | A * | 1/1996 | Ishikawa et al. ............... 331/8 |
| 5,859,572 | A * | 1/1999 | Hill ............................ 331/56 |
| 6,208,213 | B1 * | 3/2001 | Anastasyev et al. ........... 331/69 |
| 6,225,873 | B1 * | 5/2001 | Hill ............................ 332/102 |
| 6,249,190 | B1 * | 6/2001 | Rozenblit et al. ............. 331/46 |
| 6,278,336 | B1 * | 8/2001 | Tinsley et al. ................ 331/74 |
| 6,429,748 | B2 * | 8/2002 | Nicholls et al. ............... 331/56 |
| 6,525,619 | B1 * | 2/2003 | Shimizu et al. ......... 331/116 R |
| 6,577,204 | B2 * | 6/2003 | Midtgaard .................. 331/158 |
| 6,707,344 | B2 * | 3/2004 | Cargill et al. ................. 331/74 |
| 7,002,423 | B1 * | 2/2006 | Drakhlis et al. ............. 331/158 |
| 7,071,788 | B2 * | 7/2006 | Guebels ....................... 331/46 |
| 2004/0113707 | A1 * | 6/2004 | Fredriksson ................ 331/135 |

FOREIGN PATENT DOCUMENTS

JP 2003065924 * 3/2003

* cited by examiner

Primary Examiner—Dinh T. Le

(57) ABSTRACT

A differential crystal oscillator electronic circuit. Embodiments of the present invention include circuits comprising two substantially similar oscillator circuits. The oscillator circuits may be coupled to a common crystal or ceramic resonator. Embodiments of the present invention are especially well suited to implementation within integrated circuits where their superior common mode and supply rejection function beneficially in opposition to the naturally high coupling characteristics of integrated circuits. Further, by naturally furnishing differential signals, these low noise signals may be used directly by other differential circuits on an integrated circuit, without requiring additional single ended to differential conversion circuitry.

16 Claims, 3 Drawing Sheets

DIFFERENTIAL CRYSTAL OSCILLATOR

FIELD OF THE INVENTION

Embodiments of the present invention generally relate to the field of integrated circuit design. More specifically, embodiments of the present invention pertain to crystal oscillator designs.

BACKGROUND ART

A quality frequency source is often required for applications such as the local oscillator in a radio frequency transceiver, the frequency reference in a phase-locked loop, or the master clock source in a microprocessor or data-acquisition system. A crystal oscillator is an electronic circuit designed to produce such a stable, accurate frequency signal. In a crystal oscillator, the piezo-electric properties of a quartz crystal or a ceramic resonator used as a circuit element primarily determine the operating frequency. Because of their superior accuracy and stability characteristics, crystal oscillators are standard in a wide variety of electronic devices, from digital watches to "super" computers and almost all radio frequency devices.

Conventional crystal oscillators may be implemented using several different designs. FIG. 1A depicts a "digital" implementation of a conventional Pierce crystal oscillator 10. Crystal 12 is operated in a parallel resonant mode and is very inductive at its resonant frequency, which corresponds to characteristics of the crystal 12. Feedback amplifier 15 is frequently a digital inverter gate. Various implementations of this basic design are quite popular in integrated circuit digital electronics, for example as a clock source for a microprocessor.

Unfortunately, this class of "digital" oscillator produces a very square output with high harmonic content, often swinging from voltage rail to ground rail. Although generally acceptable for digital electronics, such harmonic components are generally undesirable for "analog" applications, e.g., phase locked loops and radio circuitry. In addition, the output of such "digital" oscillators contains large amounts of digital noise. This oscillator has no supply rejection or common mode rejection. Further, when implemented as part of an integrated circuit, due to its single ended or unbalanced nature, it produces deleterious electrical noise, which can be coupled via the IC substrate to other circuits on the integrated circuit, degrading their function.

FIG. 1B depicts an implementation of a conventional Colpitts crystal oscillator 20. Colpitts oscillators are widely used in low noise applications such as phase locked loops (PLLs) and radio circuitry. Transconductance amplifier 25 provides a non-inverting feedback amplifier which causes the circuit to oscillate. The Colpitts topology for a crystal oscillator is generally well regarded in discrete electronic implementations. However, when implemented as part of an integrated circuit, due to its single ended or unbalanced nature, it produces deleterious electrical noise which can be coupled via the IC substrate to other circuits on the integrated circuit, degrading their function.

There are numerous advantages to implementing portions of a crystal oscillator in an integrated circuit. In general, a crystal oscillator implemented in an IC (typically the crystal itself is not part of an IC) is less expensive in terms of component cost and manufacturing expense, and consumes less circuit board area than an implementation based on discrete components. In addition, by implementing the design and most components of the design of a crystal oscillator, integrated circuit manufacturers remove the oscillator design burden from their customers and ensure the quality and reliability of their oscillator implementation.

Unfortunately, for a substantial class of applications, for example, phase locked loops and radio circuitry, existing crystal oscillator designs are not well suited for implementation in an integrated circuit. Such known crystal oscillator designs typically suffer deleterious noise susceptibility. Input noise may be amplified and/or cause an oscillator to lock on to an undesired frequency. Further, they often generate unacceptable noise components on their output signals and frequently couple additional noise via the integrated circuit substrate.

SUMMARY OF THE INVENTION

Thus a need exists for a differential crystal oscillator with high noise rejection characteristics that produces little undesirable noise. In conjunction with the aforementioned need, a further need exists for a differential crystal oscillator that may be implemented in an integrated circuit in a straight-forward manner. A still further need exists for meeting the previously identified needs with an oscillator design that provides differential signals for use by other differential circuits on an integrated circuit, without requiring additional circuitry to convert signals from single ended to differential.

Accordingly, embodiments of the present invention provide for a differential crystal oscillator with high noise rejection characteristics that produces reduced undesirable noise. In conjunction with the aforementioned characteristics, further embodiments of the present invention provide for a differential crystal oscillator that can be implemented in an integrated circuit in a straight-forward manner, deriving additional benefits from the characteristics of integrated circuits. Still further embodiments of the present invention provide for meeting the previously identified benefits with an oscillator design that provides differential signals for use by other differential circuits on an integrated circuit, without requiring additional circuitry to convert signals from single ended to differential.

A differential crystal oscillator electronic circuit is disclosed. Embodiments of the present invention include circuits comprising two substantially similar oscillator circuits. The oscillator circuits may be coupled to a common crystal or ceramic resonator. Embodiments of the present invention are especially well suited to implementation within integrated circuits where their superior common mode and supply rejection function beneficially in opposition to the naturally high coupling characteristics of integrated circuits. Further, by naturally furnishing differential signals, these low noise signals may be used directly by other differential circuits on an integrated circuit, without requiring additional single ended to differential conversion circuitry.

Advantageously, the novel circuit is fully balanced. The circuit further takes advantage of the circuit symmetry available in integrated circuits. It also has superior common mode rejection and supply rejection. The oscillator naturally furnishes differential signals for use by other differential circuits on an integrated circuit, obviating a circuit to create differential signals from single ended signals.

Therefore, these and other objects and advantages of the present invention will become obvious to those of ordinary skill in the art after having read the following detailed description of the embodiments that are illustrated in the various drawing figures.

DETAILED DESCRIPTION OF THE INVENTION

In the following detailed description of the present invention, method and apparatus of differential crystal oscillator, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Differential Crystal Oscillator

The present invention is described in the context of frequency generation on integrated circuits. However, it is appreciated that the present invention may be utilized in other types of electronics, including discrete components, where it may be necessary or desirable to produce low noise periodic signals.

Figure 2:
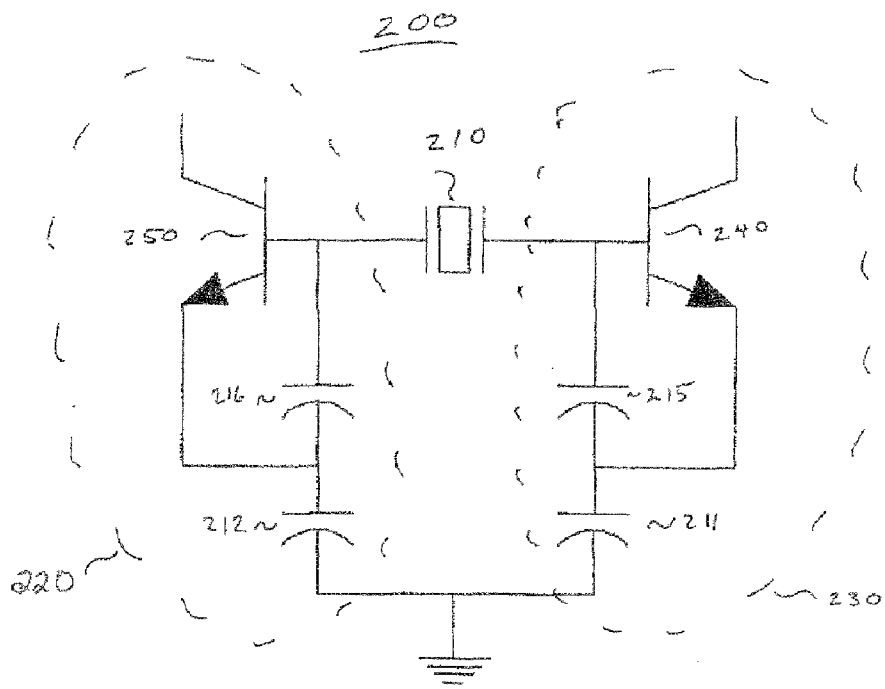
FIG. 2 illustrates an exemplary differential crystal oscillator circuit, according to an embodiment of the present invention.

FIG. 2 illustrates an exemplary differential crystal oscillator circuit 200, according to an embodiment of the present invention. It is appreciated that embodiments of the present invention are well suited to the use of other types of frequency control devices that are inductive over a relatively narrow frequency range, for example ceramic resonators, and that the use of the term "crystal" as a naming nomenclature is not intended to be limiting. In order not to obscure embodiments of the present invention, transistor bias circuitry, typically in the form of a resistor network, is not depicted.

Reactive frequency control element 210 is a device having a positive reactance over a relatively narrow range of frequencies. Quartz crystals and ceramic resonators are well known examples of such devices. One terminal of frequency control element 210 is coupled to amplification network 220, and the other terminal of frequency control element 210 is coupled to amplification network 230. Independently, amplification network 220 and amplification network 230 are substantially similar to a Colpitts single-ended crystal oscillator. Capacitor 216 is coupled between the base and emitter of active device 250, providing positive feedback. Capacitor 212 is a reactive element of network 220. Capacitor 212 is coupled to a ground reference and to capacitor 216. Capacitor 215 is coupled between the base and emitter of active device 240, providing positive feedback. Capacitor 211 is a reactive element of network 230. Capacitor 211 is coupled to a ground reference and to capacitor 215.

Frequency control element 210 is coupled to the bases of active devices 240 and 250. Active devices 240 and 250 are illustrated as NPN-type devices. It is to be appreciated that embodiments of the present invention may be constructed with any device providing transconductance, e.g., NPN, PNP, NFET or PFET types of devices in a variety of semiconductor processes, including bipolar, MOS, CMOS, BiCMOS, GaAs, etc.

Active devices 240 and 250 provide a negative resistance due to the positive feedback from emitter to base. Amplification network 220 and amplification network 230 will oscillate with an inductive component. Frequency control element 210 is only inductive near its specified frequency which is based on the physical characteristics of the crystal in one embodiment. Consequently, both networks, including frequency control element 210, oscillate at nominally the design frequency of frequency control element 210.

Figure 1A:
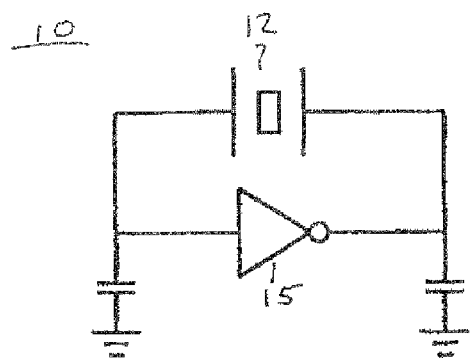
FIG. 1A depicts a "digital" implementation of a conventional Pierce crystal oscillator.
Figure 1B:
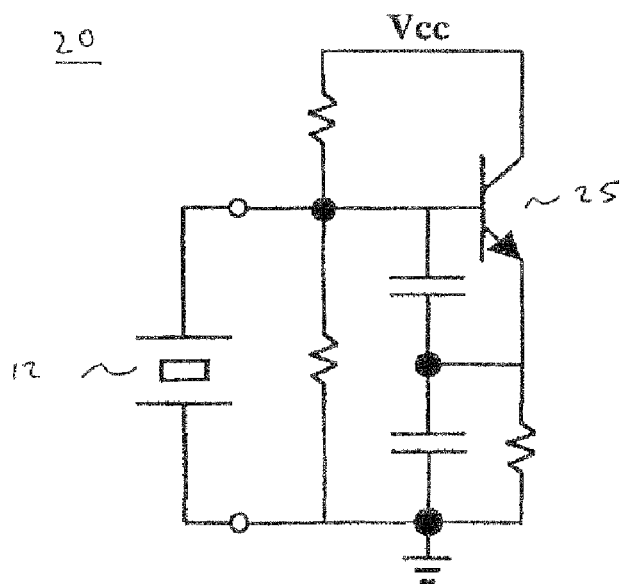
FIG. 1B depicts an implementation of a conventional Colpitts crystal oscillator.

With reference to FIG. 1B (conventional art), in a conventional configuration a Colpitts oscillator amplifies one end of crystal 12. Referring once again to FIG. 2, a signal at one end of frequency control element 210 is amplified by amplification network 220, and a signal at the other end of frequency control element 210 is amplified by amplification network 230. Due to the characteristics of frequency control element 210, the signals at each terminal are 180 degrees out of phase. Consequently, amplification network 220 amplifies a signal that is 180 degrees out of phase from the signal amplified by amplification network 230. If amplification network 220 and amplification network 230 are substantially similar, they will introduce substantially similar phase changes to those signals, and maintain a 180 degree phase relationship between the outputs of amplification networks 220 and 230. It is a well known aspect of semiconductor design that similar circuits may be implemented with great symmetry. It is to be appreciated, however, that embodiments of the present invention are well suited to the use of discrete components as well.

As a beneficial result of the above described phase relationship, a periodic signal is available as the difference between the output of amplification network 220 and amplification network 230. Differential signals inherently provide immunity to common mode noise, and may be used by other low noise circuitry. Further, due to the symmetry of differential crystal oscillator 200, it has superior rejection of common mode noise and power supply noise.

A Colpitts oscillator is used as a base herein to illustrate embodiments of the present invention. In the conventional art, a Colpitts oscillator is known to have desirable low noise and inherent frequency stability characteristics that may be employed advantageously in a differential crystal oscillator architecture. It is to be appreciated, however, that certain advantages of the present invention, e.g., common mode noise and power supply rejection and differential output, are well suited to corresponding dual configurations of other single ended oscillators, for example a Pierce oscillator, harmonic crystal oscillators, variable frequency oscillators and the like.

Figure 3:
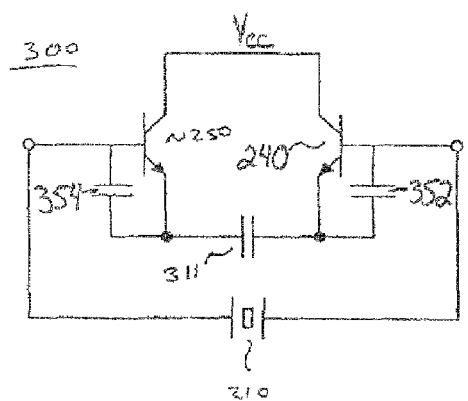
FIG. 3 illustrates an alternative embodiment of the present invention.

FIG. 3 illustrates an alternative embodiment of the present invention. Differential crystal oscillator circuit 300 is a true differential circuit, as no reference to ground is present. The collectors of active elements 240 and 250 are coupled to a voltage source, Vcc. The base of active device 250 is coupled to a first terminal of frequency control element 210. The base of active device 250 is also coupled to a first terminal of capacitor 354. The second terminal of capacitor 354 is coupled to the emitter of active device 250. Active devices 240 and 250 may be any device providing transconductance, e.g., NPN, PNP, NFET or PFET types of devices in a variety of semiconductor processes, including bipolar, MOS, CMOS, BiCMOS, GaAs, etc.

The base of active device 240 is coupled to a second terminal of frequency control element 210. The base of active device 240 is also coupled to a first terminal of capacitor 352. The second terminal of capacitor 352 is coupled to the emitter of active device 240.

The function of capacitors 211 and 212 in FIG. 2 is combined in capacitor 311 of FIG. 3. One terminal of capacitor 311 is coupled to the emitter of active device 250 while the second terminal of capacitor 311 is coupled to the emitter of active device 240. Such a combination is possible because of the differential nature of the circuit, e.g., the output signal is not referenced to ground. Differential crystal oscillator circuit 300 does not have two complete sets of single ended oscillator circuitry, but functions in the same manner as previously described for differential crystal oscillator 200.

Figure 4:
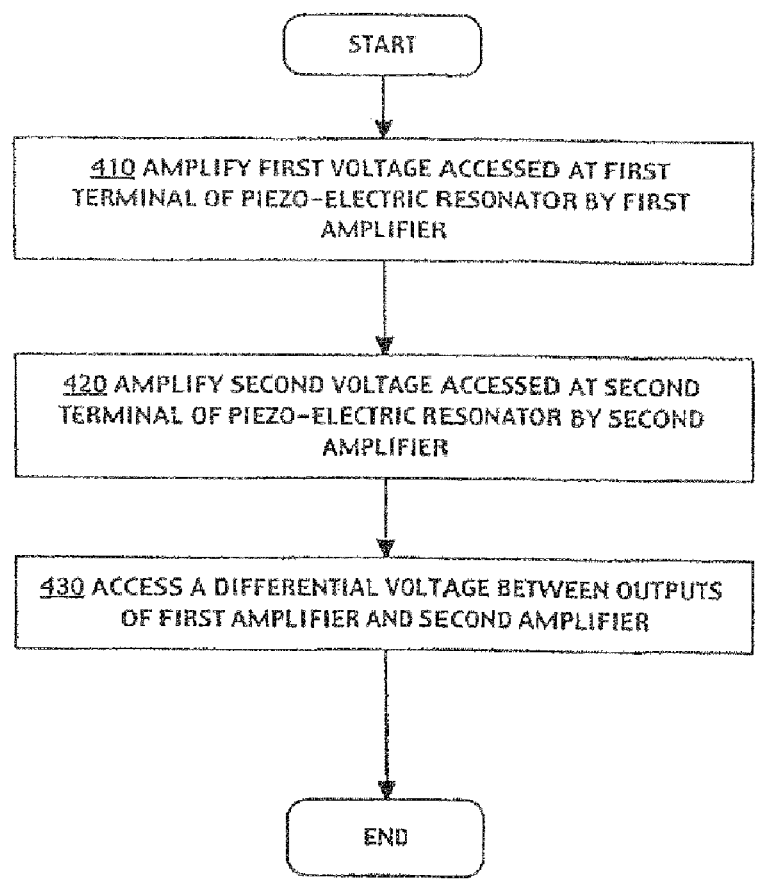
FIG. 4 illustrates a method of producing a periodic difference voltage using the oscillator circuit, according to an embodiment of the present invention.

FIG. 4 illustrates a method 400 of producing a periodic difference voltage using the differential crystal oscillator designs in accordance with embodiments of the present invention.

In step 410, a first amplifier, for example amplification network 220, amplifies a first voltage accessed at a first terminal of a piezo-electric resonator, for example frequency control element 210.

In step 420, a second amplifier, for example amplification network 230, amplifies a second voltage accessed at a second terminal of a piezo-electric resonator, for example frequency control element 210.

In step 430, a periodic differential voltage is accessed between outputs of said the first amplifier and the second amplifier Embodiments of the present invention provide for a differential crystal oscillator with high noise rejection characteristics that produces little undesirable noise. In conjunction with the aforementioned characteristics, further embodiments of the present invention provide for a differential crystal oscillator that can be implemented in an integrated circuit in a straight-forward manner, deriving additional benefits from the characteristics of integrated circuits. Still further embodiments of the present invention provide for meeting the previously identified benefits with an oscillator design that provides differential signals for use by other differential circuits on an integrated circuit, without requiring additional circuitry to convert signals from single ended to differential.

The circuit architecture of the present invention is especially applicable to radio integrated circuits, among other applications. Radio integrated circuits are excellent applications for the present invention because of the strong rejection of common mode and power supply interference. Further, since the oscillator circuit is balanced, the signals it generates will suffer little degradation from common mode noise such as is induced by the substrate of an integrated circuit.

The preferred embodiment of the present invention, differential crystal oscillator, is thus described. While the present invention has been described in particular embodiments, it should be appreciated that the present invention should not be construed as limited by such embodiments, but rather construed according to the below claims.

What is claimed is:

1. A differential crystal oscillator electronic circuit for producing a periodic signal comprising two substantially similar series resonant Colpitts oscillator circuits wherein a ceramic resonator is coupled to a respective input node of each of said two substantially similar series resonant Colpitts oscillator circuits.

2. The electronic circuit as described in claim 1 wherein an active electronic component of said differential crystal oscillator is rendered in an integrated circuit.

3. The electronic circuit as described in claim 1 wherein said differential crystal oscillator generates differential output signals.

4. The electronic circuit as described in claim 1 wherein said differential crystal oscillator generates differential output signals.

5. The electronic circuit as described in claim 1 wherein said differential crystal oscillator generates differential output signals.

6. An electronic circuit comprising:
a first transconductance device having first, base and third terminals;
a second transconductance device having first, base and third terminals;
a first reactive element having first and second terminals;
a second reactive element having first and second terminals;
wherein said third terminal of said first transconductance device is coupled to said first terminal of said first reactive element;
wherein said third terminal of said second transconductance device is coupled to said first terminal of said second reactive element;
wherein said second terminal of said first reactive element is coupled to said base terminal of said first transconductance device;
wherein said second terminal of said second reactive element is coupled to said base terminal of said second transconductance device; and
wherein said base terminal of said first transconductance device and said base terminal of said second transconductance device are disposed for coupling to terminals of one reactive frequency control element, wherein said reactive frequency control element is a crystal.

7. The electronic circuit as described in claim 6 wherein said first transconductance device is disposed within an integrated circuit.

8. The electronic circuit as described in claim 6 wherein said first transconductance device and said second transconductance device are substantially similar.

9. An electronic circuit comprising:
a first transconductance device having first, base and third terminals;
a second transconductance device having first, base and third terminals;
a first reactive element having first and second terminals;
a second reactive element having first and second terminals;
wherein said third terminal of said first transconductance device is coupled to said first terminal of said first reactive element;
wherein said third terminal of said second transconductance device is coupled to said first terminal of said second reactive element;
wherein said second terminal of said first reactive element is coupled to said base terminal of said first transconductance device;
wherein said second terminal of said second reactive element is coupled to said base terminal of said second transconductance device; and
wherein said base terminal of said first transconductance device and said base terminal of said second transconductance device are disposed for coupling to terminals of one reactive frequency control element, wherein said reactive frequency control element is a ceramic resonator.

10. An electronic circuit comprising:
a first transconductance device having first, base and third terminals;
a second transconductance device having first, base and third terminals;
a first reactive element having first and second terminals;
a second reactive element having first and second terminals;
wherein said third terminal of said first transconductance device is coupled to said first terminal of said first reactive element;
wherein said third terminal of said second transconductance device is coupled to said first terminal of said second reactive element;
wherein said second terminal of said first reactive element is coupled to said base terminal of said first transconductance device;
wherein said second terminal of said second reactive element is coupled to said base terminal of said second transconductance device;
wherein said base terminal of said first transconductance device and said base terminal of said second transconductance device are disposed for coupling to terminals of one reactive frequency control element;
a third reactive element coupled to said third terminal of said first transconductance device and to a ground reference; and
a fourth reactive element coupled to said third terminal of said second transconductance device and to a ground reference.

11. The electronic circuit as described in claim 10 further comprising a differential periodic voltage generated between said third terminal of said first transconductance device and said third terminal of said second transconductance device.

12. An electronic circuit comprising:
a first transconductance device having first, base and third terminals;
a second transconductance device having first, base and third terminals;
a first reactive element having first and second terminals;
a second reactive element having first and second terminals;
wherein said third terminal of said first transconductance device is coupled to said first terminal of said first reactive element;
wherein said third terminal of said second transconductance device is coupled to said first terminal of said second reactive element;
wherein said second terminal of said first reactive element is coupled to said base terminal of said first transconductance device;
wherein said second terminal of said second reactive element is coupled to said base terminal of said second transconductance device;
wherein said base terminal of said first transconductance device and said base terminal of said second transconductance device are disposed for coupling to terminals of one reactive frequency control element; and
a third reactive element coupled to said base terminal of said first transconductance device and to said base terminal of said second transconductance device.

13. A method of producing a periodic differential voltage comprising:
amplifying a first voltage accessed at a first terminal of a piezo-electric resonator by a first amplifier;
amplifying a second voltage accessed at a second terminal of said piezo-electric resonator by a second amplifier; and
generating a differential voltage between outputs of said first amplifier and said second amplifier,
wherein said piezo-electric resonator is a ceramic resonator.

14. The method as described in claim 13 wherein said first amplifier and said second amplifier are substantially similar.

15. The method as described in claim 14 wherein said first amplifier is substantially a Colpitts oscillator.

16. The method as described in claim 13 wherein an active element of said first amplifier comprises circuitry of an integrated circuit.

* * * * *